(12) United States Patent
Gouger et al.

(10) Patent No.: US 6,195,672 B1
(45) Date of Patent: Feb. 27, 2001

(54) SATURATION DETECTION IN FLOATING POINT TO INTEGER CONVERSIONS

(75) Inventors: Jason F. Gouger, Shawnee-on-Delaware; Jeffrey Charles Herbert, Nazareth, both of PA (US); Razak Hossain, Bridgewater, NJ (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 09/144,599

(22) Filed: Aug. 31, 1998

(51) Int. Cl.[7] ....................................... G06F 5/00
(52) U.S. Cl. .................. 708/204; 708/495; 708/209; 708/551; 708/552
(58) Field of Search ....................... 708/204, 498, 708/552, 553, 277, 495, 497, 209, 551; 712/222, 221; 345/523

(56) References Cited

U.S. PATENT DOCUMENTS

| | | | |
|---|---|---|---|
| 5,257,215 | * 10/1993 | Poon ............................... | 708/204 |
| 5,550,768 | * 8/1996 | Ogilvie et al. .................. | 708/497 |
| 5,627,773 | * 5/1997 | Wolrich et al. ................. | 708/204 |
| 5,764,548 | * 6/1998 | Keith et al. .................... | 708/204 |
| 5,995,122 | * 11/1999 | Hsieh et al. .................... | 345/523 |
| 6,061,782 | * 5/2000 | Elliott et al. ................... | 712/222 |

* cited by examiner

*Primary Examiner*—Larry D. Donaghue
*Assistant Examiner*—Jungwon Chang
(74) *Attorney, Agent, or Firm*—Columbia IP Law Group, LLC

(57) ABSTRACT

An improved method and apparatus for saturation detection in floating point to integer conversions is described. A floating point number is tested for saturation conditions based on an integer field size. From testing the saturation conditions on the floating point number, the present invention predicts whether a floating point number can be converted into an integer value having the given integer field size, or whether the integer field would be saturated. In one embodiment, the saturation conditions are tested on the floating point number in parallel with a floating point to integer conversion.

25 Claims, 7 Drawing Sheets

FIG. 3

| | SIGN | EXP | BITS M-1 TO SHIFT +1 | ROUND | SATURATION CONDITION DETECTED |
|---|---|---|---|---|---|
| CASE 1 | X | ≥ N | X | X | MSO LEFT OF INTEGER FIELD |
| CASE 2 | | | | | MSO IN MSB POSITION OF INTEGER FIELD |
| A | X | ==N-1 | X | 1 | A - ROUND UP OUT OF RANGE |
| B | 0 | ==N-1 | X | X | B - POSITIVE VALUE OUT OF RANGE |
| C | 1 | ==N-1 | !=0 | 0 | C - NEGATIVE VALUE OUT OF RANGE |
| CASE 3 | 0 | ==N-2 | ==1 | 1 | POSITIVE VALUE ROUND UP OUT OF RANGE |

M = # OF BITS IN MANTISSA FIELD + 1 FOR THE HIDDEN ONE.

N = # OF BITS IN THE INTEGER FIELD

EXP= E...E - OFFSET.

FIG. 4

FLOAT = S E E E m m m m m m

INT = [7] 6 5 4 3 2 1

BIT POSITION = M N

SHIFT = (M - I) - EXP = 6 - EXP

SATURATION DETECTION IN FLOATING POINT TO INTEGER CONVERSIONS

FIELD OF THE INVENTION

The present invention pertains to the field of digital data processing. More particularly, this invention relates to a method and apparatus for performing saturation detection for floating point to integer conversions.

BACKGROUND OF THE INVENTION

Digital data is frequently represented in either integer notation or floating point notation. One advantage of floating point notation is that a larger range of values can be represented in a given number of bit positions using floating notation then can be represented using integer notation. On the other hand, integer notation operations, such as integer addition, subtraction, etc., are often faster and more accurate than floating point operations. As a result of the various advantages for each notation, a number represented in one notation is often converted to the other notation.

Converting from floating point to integer notation, however, may not always be possible because the magnitude of a floating point number may be outside the range of an integer number. For instance, the magnitude of a floating point number may be too large to be represented in the number of bit positions available in the integer field. In which case, the floating point number "saturates" the integer field.

Generally, saturation detection takes place after a floating point number is converted to integer notation. The conversion process can take a comparatively large amount of processing time. For instance, a floating point number may need to be right shifted a particular number of bit positions, and shifting a data field can take a long time. Then, if saturation detection is performed after the data field has been right shifted, additional processing time is expended.

In order to improve data processing performance, a need exists for an improved method and apparatus for saturation detection in floating point to integer conversions.

SUMMARY OF THE INVENTION

An improved method and apparatus for saturation detection in floating point to integer conversions is described. A floating point number is tested for saturation conditions based on an integer field size. From testing the saturation conditions on the floating point number, the present invention predicts whether a floating point number can be converted into an integer value having the given integer field size, or whether the integer field would be saturated. In one embodiment, the saturation conditions are tested in parallel with a floating point to integer conversion.

BRIEF DESCRIPTION OF THE DRAWINGS

Examples of the present invention are illustrated in the accompanying drawings. The accompanying drawings, however, do not limit the scope of the present invention. Like references in the drawings indicate similar elements.

FIG. 3 illustrates a table of test conditions for one embodiment of the present invention.

FIG. 4 illustrates one embodiment of a floating point notation and an integer notation.

DETAILED DESCRIPTION

In the following description, numerous specific details are set forth in order to provide a thorough understanding of the present invention. However, those skilled in the art will understand that the present invention may be practiced without these specific details. In other instances, well known methods, procedures, components, and circuits have not been described in detail.

Figure 1:
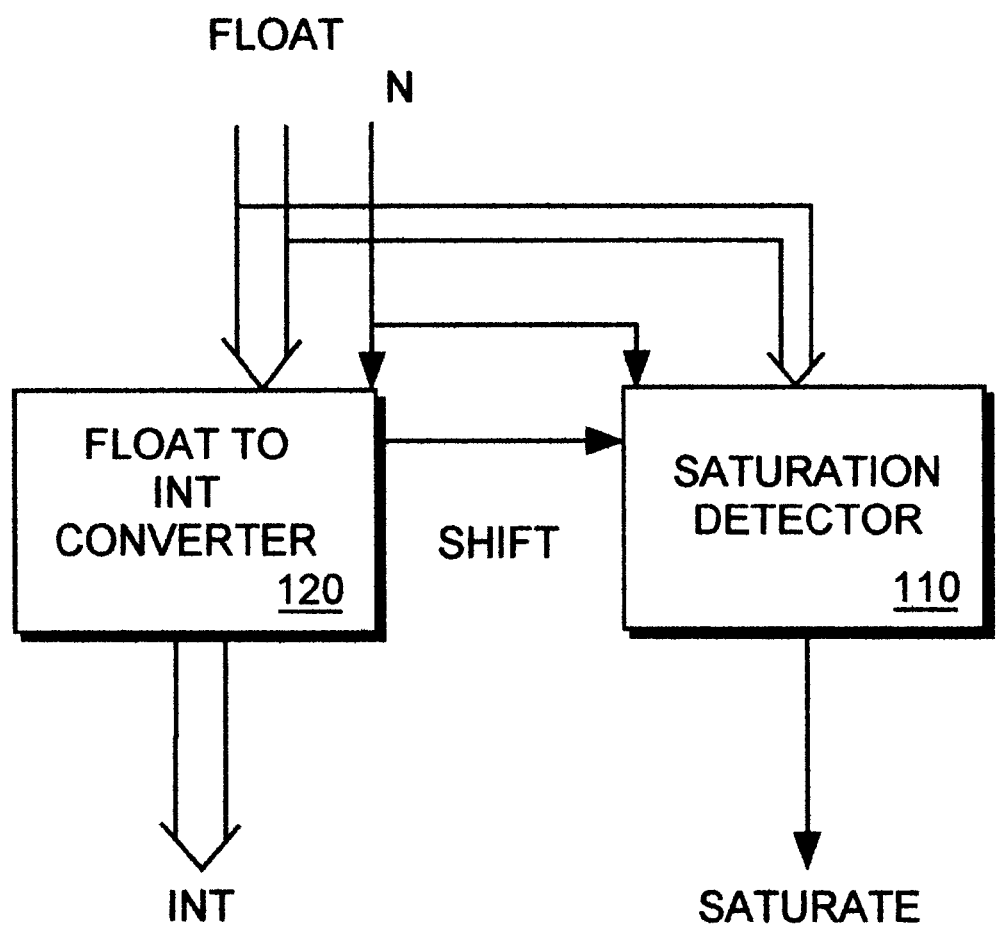
FIG. 1 illustrates one embodiment of the present invention.

FIG. 1 illustrates one embodiment of saturation detector 110 used in parallel with floating point to integer converter 120. Since saturation detector 110 operates on a floating point value before the floating point value is converted to integer notation, saturation detector 110 can work in parallel with converter 120 to predict whether or not the integer field will be saturated. As a result, the processing time for floating point to integer conversion can be shorter than a conversion process wherein saturation detection is performed serially after the floating point number has been converted.

In the illustrated embodiment, saturation detector 110 receives a floating point number, FLOAT, and an integer field size, N, in parallel with converter 120. In alternate embodiments, the integer field size may be fixed, in which case only the floating point number needs to be provided to saturation detector 110. Also in the illustrated embodiment, saturation detector 110 receives a signal, SHIFT, from converter 120 indicating the number of bit positions the floating point number will be shifted. In alternate embodiments, saturation detector 110 can independently calculate the number of bit positions the floating point number will be shifted.

The output of saturation detector 110 is a signal, SATURATE in the illustrated embodiment, which indicates whether or not the floating point value will saturate the integer field of size N. In one embodiment, when SATURATE equals one, the floating point value will saturate the integer field, and when SATURATE equals zero, the floating point value will not saturate the integer field. In alternate embodiments, saturation detector 110 may provide additional information, such as the value of one or more bits used for rounding the integer field, and the sign of the floating point number to determine if the output of converter 120 will need to be complemented.

Figure 2:
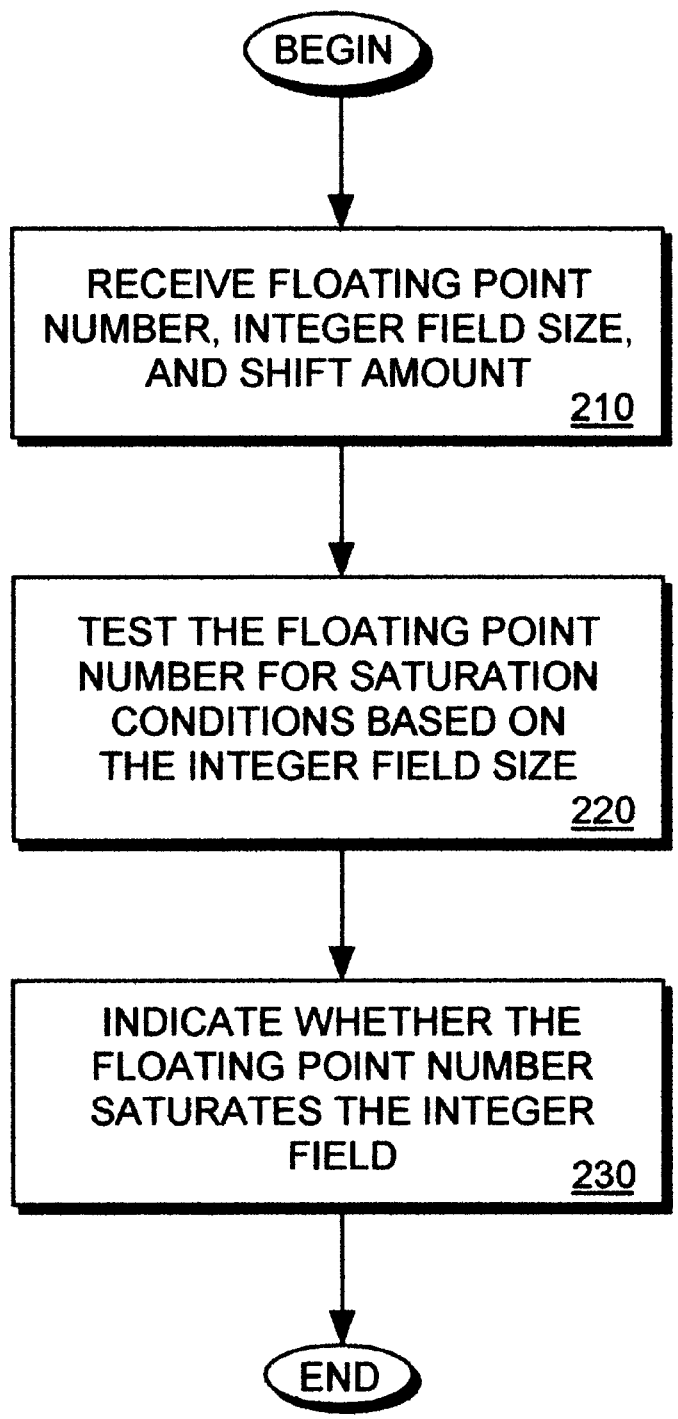
FIG. 2 illustrates a process of one embodiment of the present invention.

FIG. 2 illustrates one embodiment of a process preformed by saturation detector 110. First, in step 210, saturation detector 110 receives the floating point number, FLOAT, the integer field size, N, and the shift amount, SHIFT. In step 220, as discussed more fully below, saturation detector 110 tests the floating point number for saturation conditions based on the integer field size. Depending on the outcome of the test conditions, saturation detector 110 indicates whether or not the floating point number will saturate the integer field in step 230.

FIG. 3 illustrates one embodiment of the tested saturation conditions for a common floating point notation which will be converted to a 2's complement integer notation. The floating point notation has a sign bit, S, an exponent field, E . . . E, and a mantissa field, m . . . m. The notation is written S E . . . E m . . . m, and the value of the number being represented is determined using a formula such as:

$$(-1)^s(1.m \ldots m)2^{(E \ldots E\text{-offset})}$$

By convention, the mantissa is normalized so that the most significant one is hidden. That is, the decimal position is shifted and the exponent value is adjusted so that the most significant one is to the left of the decimal point, and so that the decimal point is to the left of the most significant bit position, m, in the mantissa field. Those skilled in the art, after reading the following description, will recognize how the saturation conditions illustrated in FIG. 3, and discussed below, can be modified to be applied to a variety of floating point notations, including but not limited to floating point notations wherein the most significant one is not hidden, and wherein the floating point notation is being converted to a variety of integer notations, such as 1's complement, signed magnitude, etc.

In order to convert a number from the illustrated floating point notation to a 2's complement integer notation, the decimal point will be moved from the left end of the mantissa field to the right end of the integer field, and the exponent value will be reduced to zero. The resulting field will be rounded as necessary to produce an integer. Converter 110 usually accomplishes this by right shifting the mantissa field by the number of bit positions in the mantissa field minus the value of the exponent in the equation illustrated above. The saturation conditions illustrated in FIG. 3, therefore, are used to predict if the most significant one will be shifted into the integer field.

In the illustrated embodiment, EXP equals E . . . E minus offset, M equals the number of bits in the mantissa field, m . . . m, plus one for the hidden most significant one, and N equals the number of bits in the integer field. There are three cases of test conditions which test the boundary between saturation and no saturation. Several examples are discussed below.

FIG. 4 illustrates an example of a particular floating point notation and a 2's complement integer field to which floating point numbers will be converted. The floating point number has one sign bit, S, a three bit exponent field, EEE, and a six bit mantissa field, mmmmmm, with a hidden one in nonexistent bit position [7]. M equals the number of bits in the floating point mantissa field plus one. In order to represent numbers having a magnitude less than one, the exponent uses an offset value. The equation for the value represented by the illustrated floating point notation is:

$$\text{FLOAT}=(-1)^s(1.mmmmmm)2^{EEE-3}$$

The range of this floating point notation is plus or minus 0.125 to plus or minus 31.75.

The integer field is four bits positions wide, IIII, wherein N equals four. The integer field is a 2's complement integer field with a range from $-2^{N-1}$ to $2^{N-1}$, which is $-8$ to $+7$ or $1000_2$ to $0111_2$.

In order to convert a value from the floating point notation to the integer notation, the floating point data field must be right shifted according to the equation SHIFT. For example, $$4_{10}=1 \times 2^2$$

$$\text{Float}=(-1)^0(1.000000)2^{101-3}=0\ 101\ 000000_2$$

$$\text{SHIFT}=(M-1)-\text{EXP}=6-2=4.$$

For the first bit position that the mantissa is right shifted, the hidden one is shifted into the mantissa field. After the right shifting, the mantissa field is:

mantissa=000100

The decimal place is now at the right of the mantissa field, so the last four digits can be dropped into the integer field.

$$\text{INT}=0100_2=4_{10}$$

Since the value being represented, $4_{10}$, is within the range of both the floating point notation and the integer notation, it is easy to see that the value can be converted from one notation to the other. As the floating point and integer field sizes increase however, and as the magnitude of values being represented approach the boundary of the integer field range, detecting saturation becomes more difficult. Fortunately, the test conditions shown in FIG. 3 define all of the circumstances under which a number in the illustrated floating point notation will saturate the illustrated integer field.

Returning now to FIG. 3, case 1 is the most straight forward saturation condition to be tested. If EXP is greater than or equal to N, then the most significant one will not be shifted enough bit positions. That is, the most significant one will end up to the left of the most significant bit position in the integer field.

For instance, in the example above, the exponent of the floating point number was EXP=2. In which case, EXP is not greater than or equal to N=4. So, case 1 does not indicate saturation. If, however, the value being represented is $16_{10}$, then the integer field will be saturated as predicted using case 1. That is, for $16_{10}$:

FLOAT=0 111 000000

$\text{EXP}=111_2-3=7-3=4$

Saturation is predicted according to case 1 because EXP= 4>=N=4. For instance, the shift amount is SHIFT=6-4=2. The resulting shifted mantissa field will be:

Mantissa=010000

In which case, the most significant one is to the left of the four-bit integer field.

The more complicated cases, cases 2 and 3 in FIG. 3, involve values for which the most significant one will end up in one of the two most significant bit positions of the integer field; bit positions 3 or 4 in the illustrated embodiment. As shown below, since one more negative number can be represented than positive numbers in a 2's complement integer field, several saturation conditions need to be tested in order to correctly predict saturation.

Case 2 is the saturation condition for the situation in which the most significant one will be shifted into the most significant bit position of the integer field; bit position 4 in the illustrated embodiment. In which case, the integer field will be saturated for all but the lowest value that can be represented by the integer field. Specifically, in the illustrated embodiment, negative $8_{10}$ is the only value that will not saturate the integer field when the most significant bit is shifted into the most significant bit position of the integer field. So, if the value will be rounded up, if the value is positive, or if less than all of the lower order bits that will be in the integer field are zero, then the integer field will be saturated. These three conditions are tested under cases 2A, 2B, and 2C.

In case 2A, in the illustrated embodiment, if the ROUND bit is one, the integer field will saturate no matter what the sign is. In the illustrated embodiment, the ROUND bit is the last bit to be shifted out of the mantissa field. It will be used to round the value after it has been converted to integer notation. ROUND will be in the bit position equal to the number of times the mantissa field will be right shifted. That is, the bit position of ROUND equals the bit position SHIFT. For example:

Value=$85_{10}$

Float=0 110 000100

N=4

EXP=$110_2$-3=6-3=3==N-1 (Case 2)

SHIFT=6-EXP=6-3=3

ROUND=bit position SHIFT=1 (Case 2A—saturation predicted)

Since ROUND equals one, the integer value will be rounded up. The shifted mantissa will be:

Shifted Mantissa=001000[1], where ROUND is shifted out

Rounded INT=$1001_2$

In four bit 2's complement notation, 1001 equals negative 7, which is not even close to the floating point number 8.5. Therefore, as predicted by case 2A, the integer field will be saturated.

In case 2B, in the illustrated embodiment, if the sign bit S is zero, the value being represented is positive. In which case, the value is out of range of the integer field if the most significant one will be shifted into the most significant bit position in the integer field. That is, for positive numbers, the most significant bit position in the integer field must be zero for 2's complement numbers. For example:

Value=+8

Float=0 110 000000

EXP=110-3=6-3=3==N-1 (Case 2)

S=0 (Case 2B—Saturation Predicted)

SHIFT=(M-1)-EXP=6-3=3

Shifted mantissa=001000

INT=1000=$-8_{10}$!=+8 (Saturation as Predicted)

In case 2C, in the illustrated embodiment, the sign of the value represented is negative, and the integer will not be rounded up. Still, if any lower order bit positions in the integer field will be non-zero, then the value will saturate the integer field. The lower order bit positions are the bit positions between the most significant one and the round bit. Therefore, if any of the bits in bit positions M−1 to SHIFT+1 are not zero, saturation is predicted. For example:

Value=−−9

FLOAT=1 110 001000

EXP=110-3=3=N-1 (Case 2)

SHIFT=6-EXP=3

S=1, AND

ROUND=bit position SHIFT=0, AND bit M−1:SHIFT+1=001!=000 (Case 2C—Saturation Predicted)

Shifted Mantissa=001001

INT=1001=$-7_{10}$!=−−9 (Saturation as Predicted)

Case 3 is the saturation condition for the situation in which the most significant one would be shifted into the second most significant bit position of the integer field; bit position 3 in the illustrated embodiment. In which case, the integer field will only be saturated under one condition. Specifically, in the illustrated embodiment, saturation will only occur where positive 7 is rounded up. So, if the exponent is equal to N minus two, the value will be rounded up, the value is positive, and all of the lower order bits that will be in the integer field are one, then the integer field will be saturated. For example:

Value=7.5

FLOAT=0 101 111000

EXP=101-3=5-3=2

SHIFT=6-EXP=4

EXP=N-2 AND

S=1 AND

ROUND=bit position SHIFT=1 AND

Bits M−1:SHIFT+1=11 (Case 3—Saturation Predicted)

Shifted Mantissa=0111[1], where ROUND is shifted out

Rounded INT=1000=$-8_{10}$!=+7.5 (Saturation as predicted)

Figure 5:
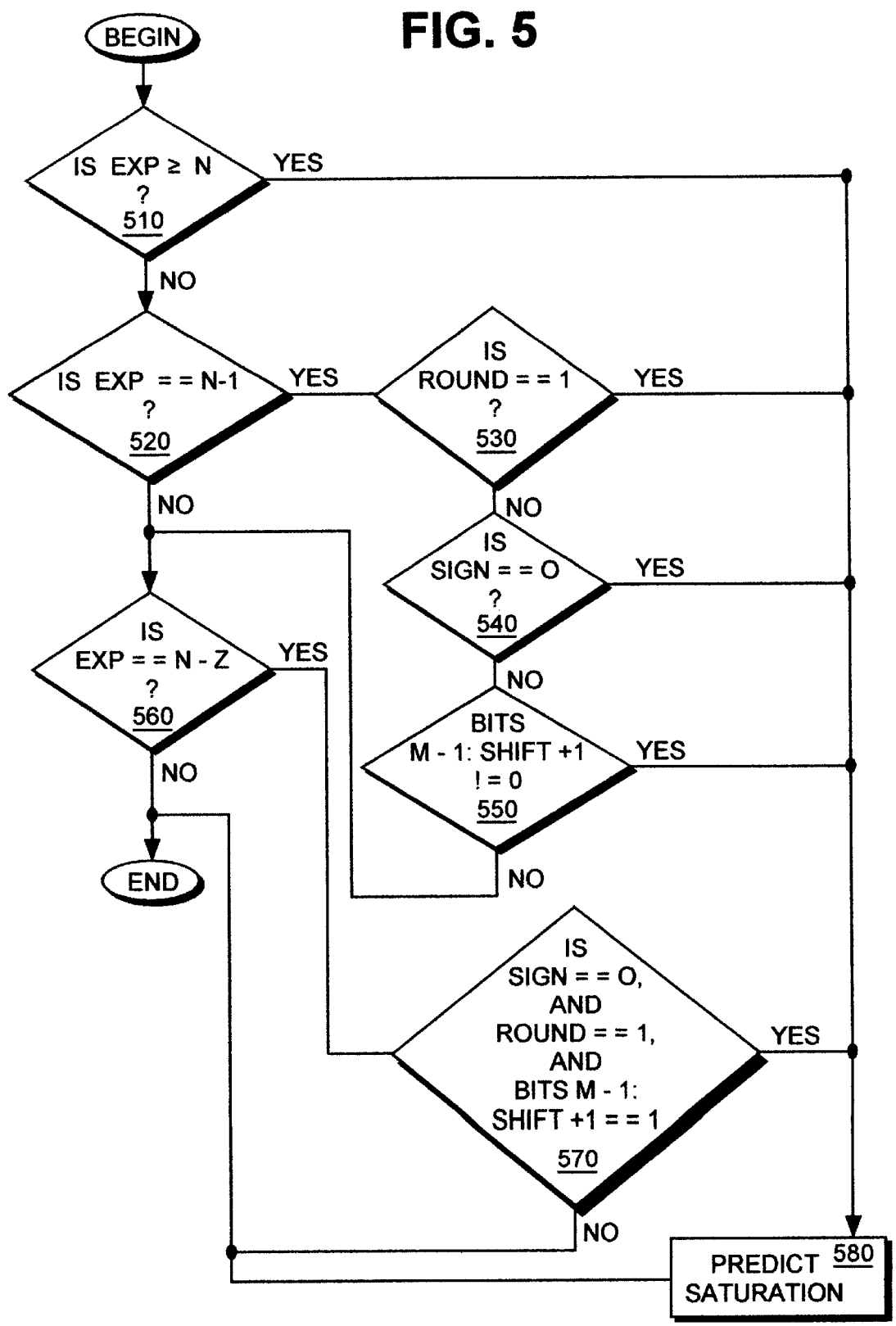
FIG. 5 illustrates a process of one embodiment of the present invention for the test conditions illustrated in FIG. 3.

FIG. 5 illustrates one embodiment of a process performed by saturation detector 110 to test all of the saturation conditions illustrated in FIG. 3. First, in step 510, saturation detector 110 determines if the exponent of the floating point number is greater than or equal to the integer field size. If the exponent is greater than or equal to the integer field size, saturation is predicted in step 580 and the process ends. If not, then in step 520, saturation detector 110 determines if the exponent is equal to one less than the integer field size. If the exponent is equal to one less than the integer field size, saturation detector 110 tests the ROUND bit in step 530. If ROUND equals one, then saturation is predicted in step 580, and the process ends. If ROUND is not one, then saturation detector 110 tests the sign bit in step 540. If the sign bit equals zero, saturation is predicted in step 580, and the process ends. If, in step 550, the sign bit is not zero, saturation detector 110 tests the lower order bits, M−1 to SHIFT+1, which will be in the integer field. If any of the lower order bits are not zero, saturation is predicted in step 580. If the lower order bits are all zero, saturation detector 110 proceeds to determine if the exponent is equal to two less than the integer field size in step 560. If the exponent is equal to two less than the integer field size, saturation detector 110 tests the sign bit for zero, the ROUND bit for one, and the lower order bits for all ones in step 570. If all three tests are true, saturation is predicted in step 580, and the process ends. Otherwise, saturation is not predicted and the process ends.

In alternate embodiments, the conditions can be tested in a different order and one or more of the conditions may be tested in parallel. Also, in certain embodiments, one or more test conditions may be combined. For instance, testing the ROUND bit in step 530 can be combined with step 550, wherein bits M−1 to SHIFT are tested for all zeros. If less than all the bits M−1 to SHIFT are zeros, saturation is predicted. Similarly, in step 570, rather than independently testing the ROUND bit, bits M−1 to SHIFT can be tested for all ones. If all of bits M−1 to SHIFT are ones, saturation is predicted. Furthermore, as discussed above, those skilled in the art will recognize that the tested conditions can be modified to accommodate a variety of floating point and integer notations.

Figure 6:
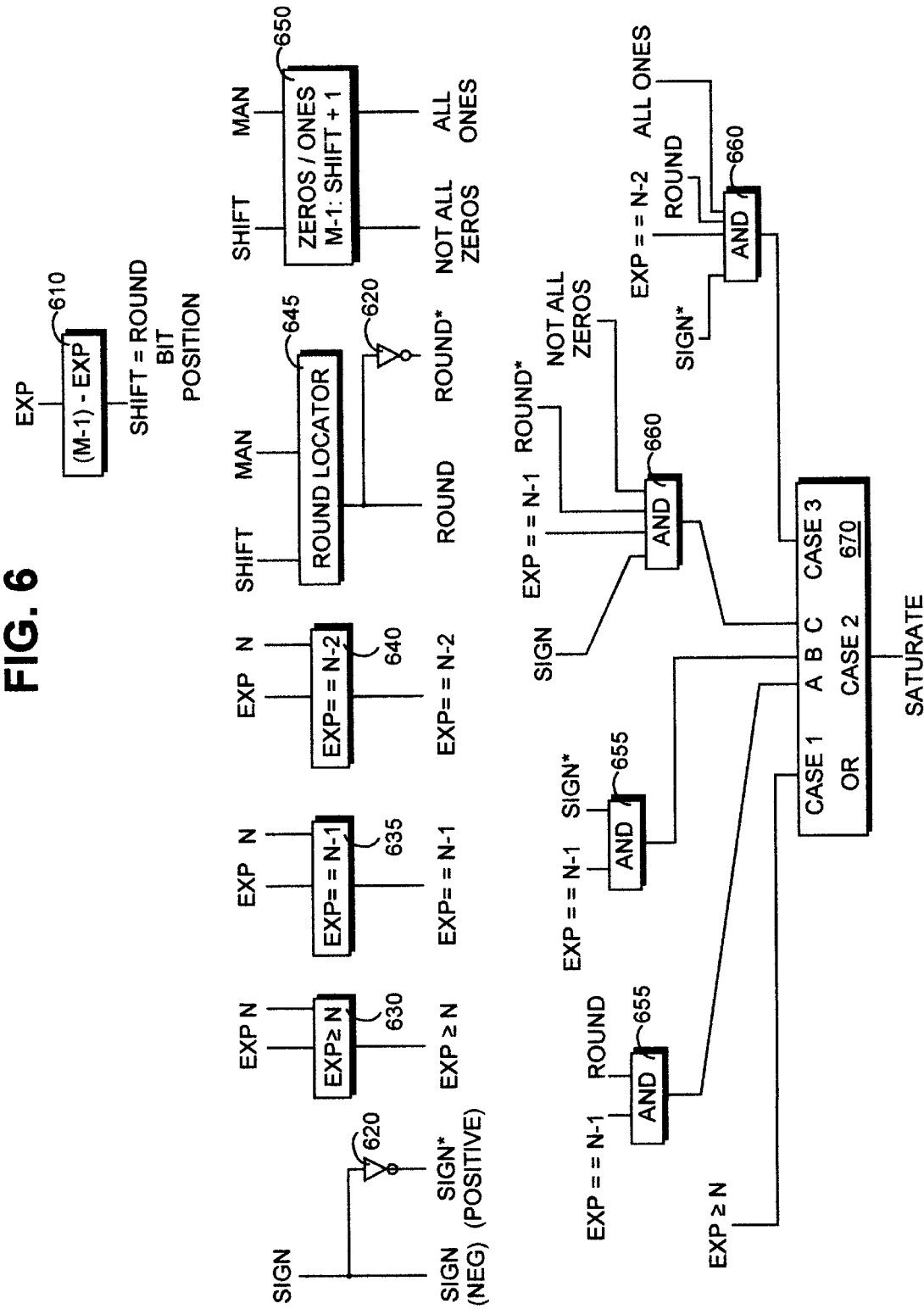
FIG. 6 illustrates a hardware system for one embodiment of the present invention.

FIG. 6 illustrates one hardware embodiment for saturation detector 110. Elements 610 to 670 may represent any of a number of digital elements known in the art. Element 610 may be an adder. Elements 630, 635, and 640 may be comparators. Round locator 645 may be a multiplexer wherein SHIFT is provide to the select lines. Any number of zeros/ones detectors can be used for element 650. Element 620 is an inverter. Element 655 is a two input AND gate. Element 660 is a four input AND gate. Element 670 is a five input OR gate. The output signal, SATURATE, is one if any of the conditions CASE 1, 2A, 2B, 2C, or 3 are true.

In alternate embodiments, one or more elements in FIG. 6 may be combined, rearranged, added, and/or deleted. For instance, as discussed above, testing the ROUND bit can be combined with zeros/ones detection, eliminating the need for round locator 645. Those skilled in the art will also recognize that various rounding algorithms may be employed, and after reading this description, will recognize how the illustrated embodiment can be modified to detect saturation from rounding for alternate rounding algorithms, such as truncation, etc.

In certain embodiments, where the integer field size is fixed, the width of the zeros/ones detectors can be fixed. For instance, in the illustrated embodiment where M=7, N=4, and the tested range is M−1 to SHIFT+1, zeros are tested when EXP=N−1=3, so SHIFT=(M−1)−EXP=6−3=3. In which case, the zeros detector needs to test three bits, bits 6 to 4. Similarly, ones are tested when EXP==N−2=2, so SHIFT=4. In which case, the ones detector needs to test two bits, bits 6 and 5. Thus, the width of the zeros and ones detectors can be fixed depending on the width of the integer field.

In alternate embodiments, saturation detector 110 may be used in series prior to converter 120. For instance, where processing time or energy conservation is desirable, saturation detector 110 can be used to selectively employ converter 120 only on floating point numbers which will not saturate the integer field size.

Figure 7:
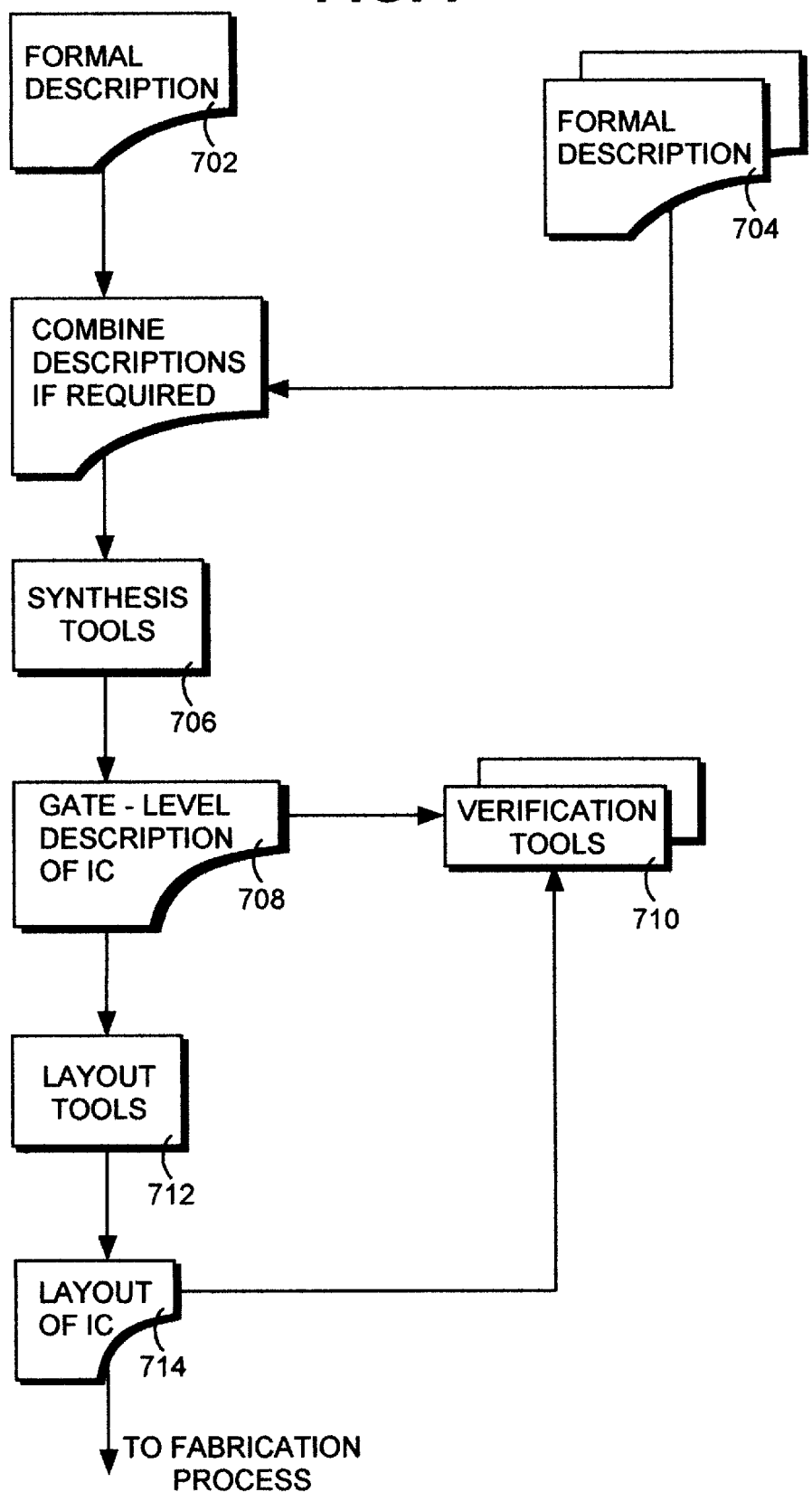
FIG. 7 illustrates one embodiment of a design flow for one embodiment of the present invention.

Turning now to FIG. 7, a block diagram is shown illustrating one embodiment of a design process for designing an integrated circuit (IC) incorporating the innovative features of saturation detector 110. As illustrated, a formal description 702 of saturation detector 110 is prepared. Formal description 702 may be prepared in any one of the formal IC description languages known in the art, such as Very High Speed Integrated Circuit (VHSIC) Hardware Description Language, or VHDL, Verilog, and the like, using any one of a number of know design description editors supporting the desired formal description language.

Formal description 702 is then optionally merged with formal descriptions 704 of other function blocks of the IC, if saturation detector 110 is to be fabricated as an integral part of a "larger" IC. Formal description 702, or the merged formal descriptions of 702 and 704, are then provided to synthesis tools 706 to synthesize, i.e. to generate, a gate-level description 708 of the IC to be fabricated. Formal description 702 is provided to synthesis tools 706 in a manner that allows the special design of saturation detector 110 to be directly incorporated into gate-level description 708, substituting for the conventional implementations that would have been otherwise synthesized for saturation detector 110 by synthesis tools 706. The gate-level description 708 may then be used by a number of verification tools 710, such as simulators or emulators, to verify the correctness of the design. An example of a verification tool is the SimExpress™ emulator product manufactured by Meta System of Sacley, France, a wholly owned subsidiary of the assignee of the present invention.

Upon verification, or in parallel, gate-level description 708 of the IC is then provided to layout tools 712 to generate physical layout description 714 of the IC. Layout description 714 is also subjected to verification by layout level ones of verification tools 710. An example of layout level verification is parasitic analysis for submicron level integration. Upon verification, layout description 714 of the IC is then provided to the fabrication process to fabricate the desired IC.

Those skilled in the art will appreciate that the design process and the fabrication process may be performed by different parties. In fact, the creation of formal description 702 may be performed by a party independent of the party or parties who prepare formal descriptions 704 for the other function blocks, and/or the party or parties who perform the synthesis, verifications, etc. Formal description 702 may be provided to these other parties via any one of a number of known data transfer methods, e.g. through a removable storage medium such as magnetic tape, compact disk (CD), digital versatile disk (DVD), and the like, or through networked data communication links. In this context, formal description 702 is often referred to as a "soft core." Thus, an improved method and apparatus for saturation detection in floating point to integer conversions is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. A method comprising:

receiving a floating point number and an integer field size indicating a number of bit positions in an integer field;

comparing an exponent value of the floating point number to the integer field size to produce a set of relational outputs;

determining whether ones or zeros are present in particular bit positions of a mantissa of the floating point number to produce a set of boundary condition outputs; and predicting whether the floating point number when converted to an integer value would saturate the integer field based on at least one of a sign of the floating point number, the set of relational outputs, and the set of boundary condition outputs.

2. The method of claim 1 wherein the method is performed in parallel with a floating point to integer conversion.

3. The method of claim 1 wherein the set of relational outputs indicates whether a most significant one of the floating point number would be in a bit position more significant than a most significant bit position in the integer field, wherein the integer field would be saturated.

4. The method of claim 3 wherein the most significant one of the floating point number would be in a bit position more significant than a most significant bit position in the integer field if the exponent value is greater than or equal to the integer field size.

5. The method of claim 1 wherein the set of relational outputs indicates whether a most significant one of the floating point number would be in a most significant bit position of the integer field, wherein the integer field would be saturated if the integer value would be rounded up, or the floating point number is positive, or the floating point number is negative and less than all lower order bits of the integer value would be non-zero.

6. The method of claim 5 wherein the most significant one of the floating point number would be in a most significant bit position of the integer field if the exponent value is equal to one less than the integer field size.

7. The method of claim 5 wherein the integer value would be rounded up if a rounding bit of the set of boundary condition outputs is one, wherein the rounding bit is in a bit position in the mantissa of the floating point number equal to a number of bit position shifts needed to convert the floating point number to the integer value.

8. The method of claim 5 wherein the floating point number is positive if a sign bit of the floating point number is zero, and negative if a sign bit of the floating point number is one.

9. The method of claim 5 wherein the set of boundary condition outputs indicates that less than all of the lower order bits of the integer field would be non-zero if less than all bits in the mantissa of the floating point number from one bit position less significant than the most significant one to one bit position more significant than a rounding bit are zero, wherein the rounding bit is in a bit position in the floating point number equal to a number of bit position shifts needed to convert the floating point number to the integer value.

10. The method of claim 1 wherein the set of relational outputs indicates whether a most significant one of the floating point number would be in a second most significant bit position of the integer field, wherein the integer field would be saturated if the integer value would be rounded up, and the floating point number is positive, and all lower order bits of the integer value would be one.

11. The method of claim 10 wherein the most significant one of the floating point number would be in a second most significant bit position of the integer field if the exponent value is equal to two less than the integer field size.

12. The method of claim 10 wherein the integer value would be rounded up if a rounding bit of the set of boundary condition outputs is one, wherein the rounding bit is in a bit position in the mantissa of the floating point number equal to a number of bit position shifts needed to convert the floating point number to the integer value.

13. The method of claim 10 wherein the floating point number is positive if a sign bit of the floating point number is zero, and negative if a sign bit of the floating point number is one.

14. The method of claim 10 wherein the set of boundary condition outputs indicates that all of the lower order bits of the integer field would be one if all bits in the floating point number from one bit position less significant than the most significant one to one bit position more significant than a rounding bit are one, wherein the rounding bit is in a bit position in the mantissa of the floating point number equal to a number of bit position shifts needed to convert the floating point number to the integer value.

15. A machine readable storage medium having stored thereon machine executable instructions, the execution of said machine executable instructions to implement a method comprising:

receiving a floating point number and an integer field size indicating a number of bit positions in an integer field;

comparing an exponent value of the floating point number to the integer field size to produce a set of relational outputs;

determining whether ones or zeros are present in particular bit positions of a mantissa of the floating point number to produce a set of boundary condition outputs; and predicting whether the floating point number when converted to an integer value would saturate the integer field based on at least one of a sign of the floating point number, the set of relational outputs, and the set of boundary condition outputs.

16. The machine readable storage medium of claim 15 wherein the method is performed in parallel with a floating point to integer conversion.

17. The machine readable storage medium of claim 15 wherein the the set of relational outputs indicates whether a most significant one of the floating point number would be in a bit position more significant than a most significant bit position in the integer field, wherein the integer field would be saturated.

18. The machine readable storage medium of claim 15 wherein the the set of relational outputs indicates whether a most significant one of the floating point number would be in a most significant bit position of the integer field, wherein the integer field would be saturated if the integer value would be rounded up, or the floating point number is positive, or the floating point number is negative and less than all lower order bits of the integer value would be non-zero.

19. The machine readable storage medium of claim 15 wherein the the set of relational outputs indicates whether a most significant one of the floating point number would be in a second most significant bit position of the integer field, wherein the integer field would be saturated if the integer value would be rounded up, and the floating point number is positive, and all lower order bits of the integer value would be one.

20. An apparatus comprising:

an input port to receive a floating point number and an integer field size indicating a number of bit positions in an integer field;

a comparator to compare an exponent value of the floating point number to the integer field size to produce a set of relational outputs;

a plurality of logic elements to determine whether ones or zeros are present in particular bit positions of a mantissa of the floating point number to produce a set of boundary condition outputs; and a combinational logic unit to predict whether the floating point number when converted to an integer value would saturate the integer field based on at least one of a sign of the floating point number, the set of relational outputs and the set of boundary condition outputs.

21. The apparatus of claim 20 wherein the apparatus is to operate in parallel with a floating point to integer conversion unit.

22. The apparatus of claim 20 wherein the set of relational outputs indicates whether a most significant one of the floating point number would be in a bit position more significant than a most significant bit position in the integer field, wherein the integer field would be saturated.

23. The apparatus of claim 20 wherein the set of relational outputs indicates whether a most significant one of the floating point number would be in a most significant bit position of the integer field, wherein the integer field would be saturated if the integer value would be rounded up, or the floating point number is positive, or the floating point number is negative and less than all lower order bits of the integer value would be non-zero.

24. The apparatus of claim 20 wherein the set of relational outputs indicates whether a most significant one of the floating point number would be in a second most significant bit position of the integer field, wherein the integer field would be saturated if the integer value would be rounded up, and the floating point number is positive, and all lower order bits of the integer value would be one.

25. The apparatus of claim 20 wherein the plurality of logic elements comprise:

a rounding detector to predict if the integer value would be rounded up;

a sign detector to detect a sign bit of the floating point number; and a zeros/ones detector to predict if less than all lower order bits of the integer field would be non-zero.

* * * * *

UNITED STATES PATENT AND TRADEMARK OFFICE
CERTIFICATE OF CORRECTION

PATENT NO. : 6,195,672 B1
DATED : February 27, 2001
INVENTOR(S) : Jason F. Gouger et al.

It is certified that error appears in the above-identified patent and that said Letters Patent is hereby corrected as shown below:

Column 3,
Line 57, "$2^{N-1}$" should read -- $2^{N-1}-1$ --.

Column 5,
Line 15, "$85_{10}$" should read -- $8.5_{10}$ --.
Line 65, "Value = --9" should read -- Value = -9 --.

Column 6,
Line 1, "EXP=110-3=3=N-1" should read -- EXP=110-3=3= =N-1 --.
Line 11, "INT=1001=-$7_{10}$!= --9" should read -- INT=1001= -$7_{10}$!= -9 --.
Line 32, "EXP=N-2 AND" should read -- EXP= =N-2 AND --.
Line 34, "S=1" should read -- S=0 --.
Line 38, "Bits M-1:SHIFT+1=11" should read -- Bits M-1:SHIFT+1= =11 --.

Column 7,
Line 42, "EXP=N-1=3" should read -- EXP= =N-1=3 --.

Signed and Sealed this

Ninth Day of September, 2003

JAMES E. ROGAN
*Director of the United States Patent and Trademark Office*